(12) United States Patent
Murakami et al.

(10) Patent No.: US 11,231,569 B2
(45) Date of Patent: Jan. 25, 2022

(54) LIGHT-EMITTING DEVICE AND ILLUMINATION DEVICE

(71) Applicant: PANASONIC CORPORATION, Osaka (JP)

(72) Inventors: Kimihiro Murakami, Osaka (JP); Kiyoshi Morimoto, Osaka (JP); Ryo Haseyama, Osaka (JP)

(73) Assignee: PANASONIC CORPORATION, Osaka (JP)

(*) Notice: Subject to any disclaimer, the term of this patent is extended or adjusted under 35 U.S.C. 154(b) by 4 days.

(21) Appl. No.: 16/436,555

(22) Filed: Jun. 10, 2019

(65) Prior Publication Data

US 2019/0386457 A1    Dec. 19, 2019

Related U.S. Application Data

(60) Provisional application No. 62/684,434, filed on Jun. 13, 2018.

(51) Int. Cl.
    *G02B 19/00*    (2006.01)
    *H01S 5/00*    (2006.01)
    (Continued)

(52) U.S. Cl.
    CPC ..... *G02B 19/0052* (2013.01); *G02B 27/0927* (2013.01); *G02B 27/0955* (2013.01);
    (Continued)

(58) Field of Classification Search
    CPC ...... H01S 5/4031; H01S 5/005; H01S 5/0092; H01S 5/4025–426; H01S 5/40–426; H01S 2301/206
See application file for complete search history.

(56) References Cited

U.S. PATENT DOCUMENTS

2005/0105301 A1    5/2005   Takeda et al.
2006/0256335 A1*  11/2006  Chen ................. G02B 27/0905
    356/369

(Continued)

FOREIGN PATENT DOCUMENTS

CN    105826806 A  *  8/2016  ......... G02B 27/0961
CN    107851961 A  *  3/2018  ......... G02B 27/0955
(Continued)

*Primary Examiner* — Joshua King
(74) *Attorney, Agent, or Firm* — McDermott Will & Emery LLP

(57) ABSTRACT

Included are: a laser light source which emits a plurality of laser beams; an aspherical lens which the plurality of laser beams emitted from the laser light source enters and which converts the plurality of laser beams into convergent beams; and a phosphor which is irradiated with the convergent beams from the aspherical lens as excitation beams to generate fluorescence, wherein the plurality of laser beams have different spread angles in a horizontal direction and a vertical direction and enter the aspherical lens while arranged in a direction in which the spread angle is smaller, from among the horizontal direction and the vertical direction, and the aspherical lens has a function of equalizing a light intensity in a direction in which the spread angle is larger, from among the horizontal direction and the vertical direction.

5 Claims, 10 Drawing Sheets

(51) Int. Cl.
  *G02B 27/09* (2006.01)
  *H01S 5/40* (2006.01)
  *H01S 5/02253* (2021.01)
  *H01S 5/02257* (2021.01)

(52) U.S. Cl.
  CPC .......... *H01S 5/0071* (2013.01); *H01S 5/0087* (2021.01); *H01S 5/02253* (2021.01); *H01S 5/4031* (2013.01); *H01S 5/02257* (2021.01); *H01S 2301/206* (2013.01)

(56) References Cited

U.S. PATENT DOCUMENTS

| | | | |
|---|---|---|---|
| 2007/0242327 A1* | 10/2007 | Powell | G02B 27/46 359/204.1 |
| 2009/0003400 A1* | 1/2009 | Nagahama | H01S 5/02257 372/50.23 |
| 2009/0237915 A1* | 9/2009 | Liu | G02B 27/0966 362/97.1 |
| 2011/0248624 A1* | 10/2011 | Kishimoto | G02B 6/0006 313/483 |
| 2012/0314442 A1 | 12/2012 | Takahashi et al. | |
| 2013/0128584 A1* | 5/2013 | Koike | F21V 13/04 362/259 |
| 2014/0369064 A1* | 12/2014 | Sakaue | F21V 9/40 362/553 |
| 2015/0229108 A1* | 8/2015 | Steigerwald | H01S 5/4031 372/45.01 |
| 2015/0316234 A1* | 11/2015 | Samonji | G02B 27/0983 362/84 |
| 2015/0377430 A1* | 12/2015 | Bhakta | F21S 41/176 362/84 |
| 2015/0377442 A1* | 12/2015 | Bhakta | F21S 41/25 362/510 |
| 2016/0085078 A1* | 3/2016 | Ronen | G02B 6/0005 348/79 |
| 2016/0131314 A1* | 5/2016 | Waragaya | H01S 5/02257 362/538 |
| 2016/0131334 A1* | 5/2016 | Rousseau | G02B 27/0916 362/19 |
| 2016/0258587 A1* | 9/2016 | Ahn | F21S 41/16 |
| 2017/0051883 A1* | 2/2017 | Raring | H01S 5/32 |
| 2017/0284634 A1* | 10/2017 | Kiyota | F21S 41/176 |
| 2018/0316160 A1* | 11/2018 | Raring | H01S 5/32 |
| 2019/0032907 A1* | 1/2019 | Kuribayashi | H01S 5/02325 |
| 2019/0250490 A1* | 8/2019 | Yokobayashi | G03B 21/208 |
| 2019/0288482 A1* | 9/2019 | Hayashi | H01S 5/02253 |
| 2019/0324281 A1* | 10/2019 | Diebold | G02B 19/0004 |
| 2020/0386386 A1* | 12/2020 | Murai | G02B 27/0916 |

FOREIGN PATENT DOCUMENTS

| | | | | |
|---|---|---|---|---|
| CN | 108307646 A | * | 7/2018 | ............ F21S 45/70 |
| JP | 2005-150041 A | | 6/2005 | |
| JP | 2013-030453 A | | 2/2013 | |
| JP | 2013-130835 A | | 7/2013 | |
| WO | WO-2013094221 A | * | 6/2013 | ............ F21V 9/08 |
| WO | WO-2013094222 A1 | * | 6/2013 | ............ F21S 41/176 |
| WO | WO-2014115194 A1 | * | 7/2014 | ............ F21V 13/04 |
| WO | WO-2014115492 A1 | * | 7/2014 | ............ F21V 9/08 |
| WO | WO-2015011857 A1 | * | 1/2015 | ........ G02B 19/0052 |
| WO | WO-2015189947 A1 | * | 12/2015 | ........ G03B 21/2033 |
| WO | WO-2016067899 A1 | * | 5/2016 | ............ G02B 6/0006 |
| WO | WO-2016092743 A1 | * | 6/2016 | ............ F21K 9/64 |
| WO | WO-2017090675 A1 | * | 6/2017 | ............ F21S 43/26 |
| WO | WO-2017115778 A1 | * | 7/2017 | ............ F21S 41/16 |
| WO | WO-2017195620 A1 | * | 11/2017 | ............ H01S 5/005 |
| WO | WO-2018168429 A1 | * | 9/2018 | ............ F21V 5/04 |
| WO | WO-2018180950 A1 | * | 10/2018 | ............ F21S 41/285 |

* cited by examiner

LIGHT-EMITTING DEVICE AND ILLUMINATION DEVICE

CROSS REFERENCE TO RELATED APPLICATION

This application claims the benefit of priority of U.S. Provisional Patent Application No. 62/684,434 filed on Jun. 13, 2018, the entire content of which is hereby incorporated by reference.

BACKGROUND

1. Technical Field

The present disclosure relates to a light-emitting device which irradiates a phosphor with a laser beam provided from a semiconductor laser element to generate fluorescence from the phosphor and an illumination device which uses, as an illumination beam, the fluorescence generated by the light-emitting device.

2. Description of the Related Art

Illumination devices which use a semiconductor laser element include: for example, a spot illuminator, a vehicle headlight, a projector, and an endoscope illuminator. All of such illumination devices use, as an illumination light source, fluorescence generated by excitation of a phosphor represented by yttrium, aluminum, or garnet (YAG) as a result of focused irradiation of the phosphor with a laser beam having a wavelength of nearly 400 nm or nearly 450 nm or a radiation beam composed of scattering components of the fluorescence and an excitation beam. The illumination light source which uses the semiconductor laser element can have a smaller size of a light emission point than an illuminator which uses a light emitting diode (LED), and thus luminance of the illumination device increases. As a result, an illumination beam with a higher degree of parallelism than a degree of parallelism in a projection optical system can be obtained, and thus a distant area can be irradiated without a blurred beam, making it possible to downsize an optical system for forwardly irradiating a radiation beam.

Suggested in Japanese Unexamined Patent Application Publication No. 2005-150041 as an example of a conventional illumination device which combines a phosphor with a semiconductor laser element is an illumination device which irradiates a phosphor with, as an excitation beam, a laser beam emitted from the semiconductor laser element by use of one condenser lens to generate fluorescence from the phosphor and then forwardly irradiates the fluorescence with a reflection surface.

However, with the conventional illumination device described above, squeezing the high-power laser beam on the phosphor for the purpose of creating a high luminance, high-power illumination beam results in a too high light intensity and excited electrons are exhausted, thus causing so-called luminance saturation in which conversion efficiency in the phosphor is saturated. Moreover, temperature quenching of the phosphor following a temperature increase may occur. Further, there arises a problem that an excessive increase in the temperature over a heatproof temperature of the phosphor results in burning and deterioration of the phosphor itself.

SUMMARY

In view of the problem described above, the present disclosure has been made and it is an object of the present disclosure to provide a light-emitting device which suppresses a partial increase in an intensity of a laser beam irradiating phosphor and prevents luminance saturation as well as temperature quenching and deterioration of the phosphor and an illumination device which uses, as an illumination beam, fluorescence generated by the light-emitting device.

A light-emitting device according to one aspect of the present disclosure includes: a laser light source which emits a plurality of laser beams; an aspherical lens which the plurality of laser beams emitted from the laser light source enter and which converts the plurality of laser beams into convergent beams; and a phosphor which is irradiated with the convergent beams from the aspherical lens as excitation beams to generate fluorescence. The plurality of laser beams have different spread angles in a horizontal direction and a vertical direction and enter the aspherical lens while arranged in a direction in which the spread angle is smaller, from among the horizontal direction and the vertical direction. The aspherical lens has a function of equalizing a light intensity in a direction in which the spread angle is larger, from among the horizontal direction and the vertical direction.

In the light-emitting device with such configuration, the convergent beams directed from the aspherical lens towards the phosphor have an equal light intensity in the direction in which the spread angle of the laser beams is larger as a result of action of the aspherical lens and have an equal light intensity in the direction in which the spread angle of the plurality of laser beams is smaller as a result of overlapping of the plurality of laser beams. Thus, it is possible to irradiate the phosphor with beams with equalized light intensities in both the horizontal and vertical directions.

In the light-emitting device according to one aspect of the present disclosure, the phosphor may be arranged at a position shifted closer to the aspherical lens than to a focal plane where paraxial rays of a beam passing through the aspherical lens are focused.

In this case, the phosphor can be arranged at a position where the light intensities in both the horizontal and vertical directions are most equalized.

In the light-emitting device according to one aspect of the present disclosure, for the plurality of laser beams, a plurality of light emission regions may be arranged in the direction in which the spread angle is smaller.

In this case, an arrangement direction and an interval of the laser beams entering the aspherical lens can be adjusted based on positions of the light emission regions of a laser element.

In the light-emitting device according to one aspect of the present disclosure, the laser light source may include a semiconductor laser element having the plurality of light emission regions in a single element structure.

In this case, the plurality of light emission regions can be arranged cyclically at small intervals and use of the semiconductor laser element with optimized intervals between the light emission regions permits optimization of a degree of overlapping of the plurality of laser beams entering the aspherical lens.

An illumination device according to another aspect of the present disclosure includes: the light-emitting device according to one aspect of the present disclosure described above; and an optical component which releases, in a predetermined direction, the fluorescence generated from the light-emitting device.

With the illumination device with such configuration, it is possible to release, as an illumination beam to an outside, the fluorescence generated by irradiating the beam with the equalized intensities in both the horizontal and vertical directions.

Effects of Present Disclosure

The present disclosure can provide a light-emitting device which prevents luminance saturation as well as temperature quenching and deterioration of a phosphor caused by irradiating the phosphor with beams with equalized optical intensities in both a horizontal and a vertical directions as excitation beams, and an illumination device which uses, as an illumination beam, fluorescence generated by the light-emitting device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments of the present disclosure will be described in detail. Note that the embodiments described below each illustrate one detailed example of the present disclosure. Numerical values, shapes, materials, components, arrangement positions and connection modes of the components, steps, a sequence of the steps, etc., illustrated in the embodiments below are each one example and are thus not intended to limit the present disclosure in any manner. Moreover, of the components in the embodiments below, those not described in independent claims which indicate primary concepts of the present disclosure will be described as desired components.

Embodiment 1

Figure 1:
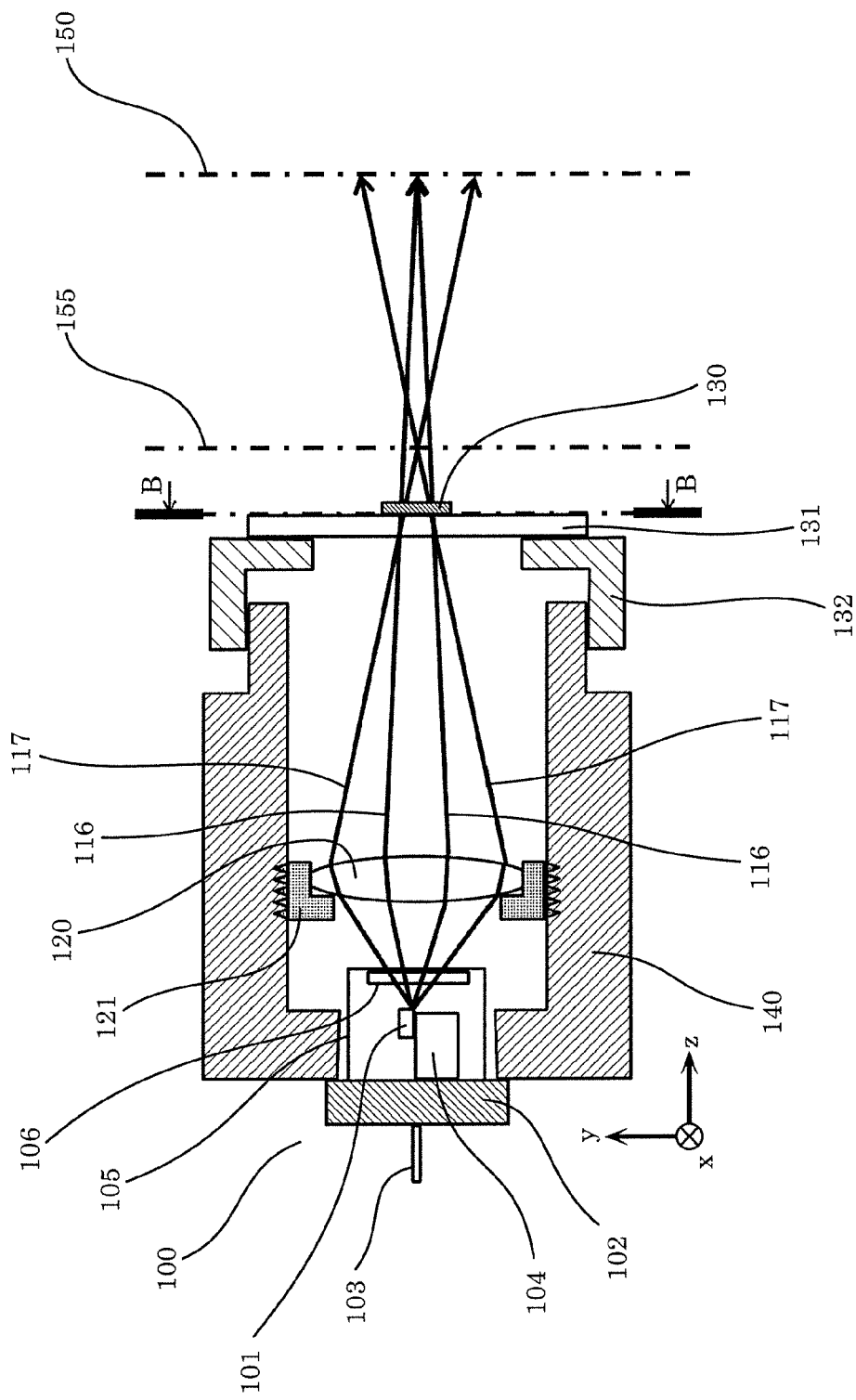
FIG. 1 is a vertical sectional view illustrating schematic configuration of a light-emitting device according to Embodiment 1 of the present disclosure.
Figure 2:
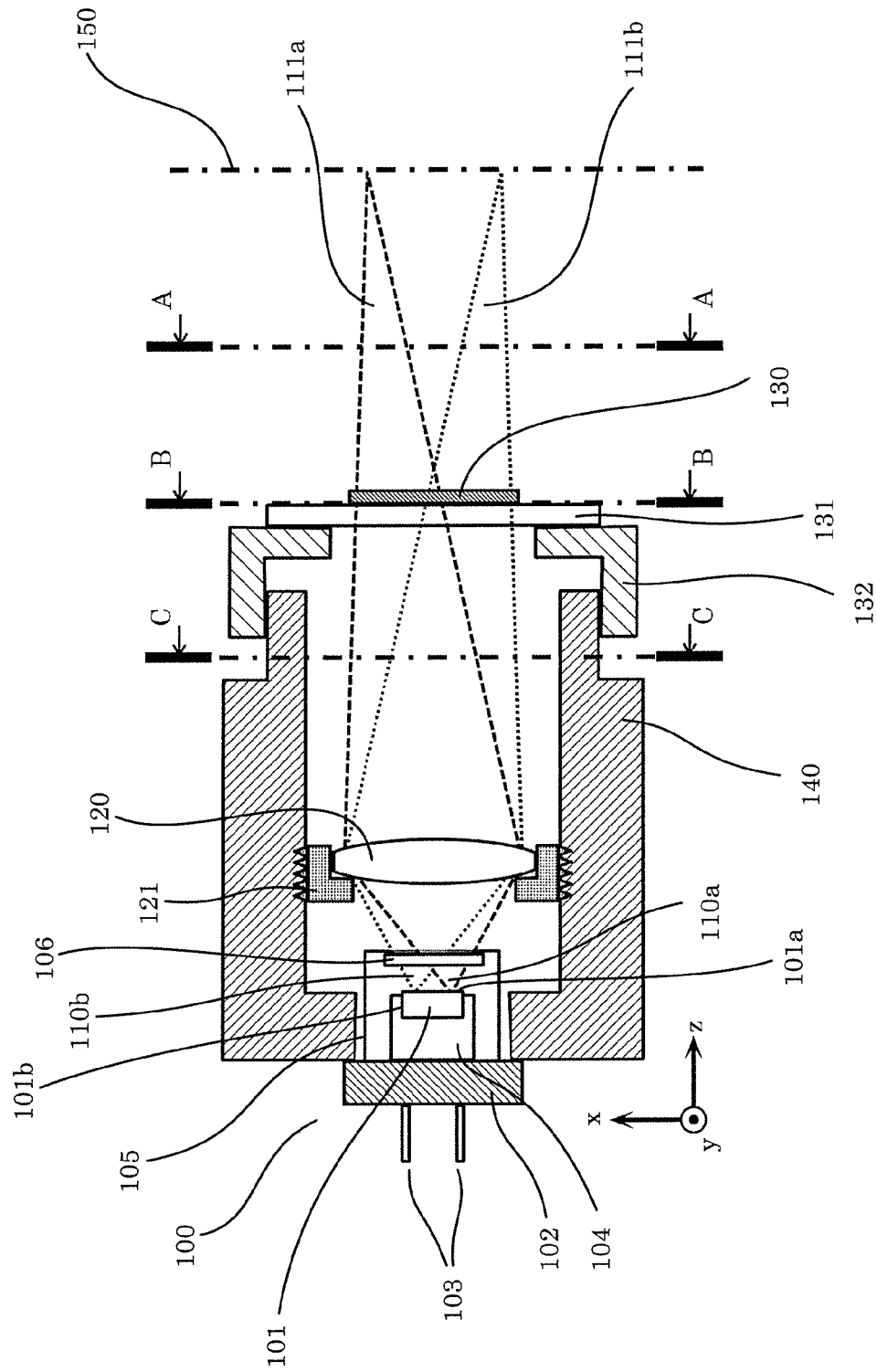
FIG. 2 is a horizontal sectional view illustrating the schematic configuration of the light-emitting device according to Embodiment 1.

FIG. 1 is a vertical sectional view illustrating schematic configuration of a light-emitting device according to Embodiment 1 of the present disclosure and FIG. 2 is a horizontal sectional view illustrating the schematic configuration of the light-emitting device according to Embodiment 1 of the present disclosure. FIGS. 1 and 2 illustrate three-dimensional orthogonal coordinate axes including an x-axis, a y-axis, and a z-axis. The vertical section of FIG. 1 is taken along a plane y-z and the horizontal section of FIG. 2 is taken long a plane x-z.

The light-emitting device of Embodiment 1 includes: as illustrated in FIGS. 1 and 2, laser light source 100, aspherical lens 120, and phosphor 130.

Laser light source 100 is a light source which emits a plurality of laser beams and includes: semiconductor laser element 101; stem 102, electrode pin 103, sub-mount 104, protection cap 105, and window part 106, and one package is formed with stem 102, protection cap 105, and window part 106. Semiconductor laser element 101 is stored in the aforementioned package. Specifically, sub-mount 104 is attached to an inner surface of stem 102 and semiconductor laser element 101 is fixed on sub-mount 104. Semiconductor laser element 101 is disposed in a direction in which the laser beams are emitted from window part 106 to an outside of the package. Electrode pin 103 for power supply to semiconductor laser element 101 is outwardly projected from stem 102.

Laser light source 100 is fixed in a manner such as to engage with a hole part formed on one side surface of housing 140 of a cylindrical shape, and electrode pin 103 projects outwardly from one side surface of housing 140. The laser beams are emitted from semiconductor laser element 101 towards an inside of housing 140. Aspherical lens 120 is fixed on an inner surface of housing 140 with lens holder 121 in between. The laser beams from semiconductor laser element 101 enter aspherical lens 120. As a result of making the plurality of laser beams, which have been emitted from laser light source 100, enter aspherical lens 120, aspherical lens 120 converts the plurality of laser beams, which has entered, into convergent beams.

Phosphor 130 is formed on transparent substrate 131 in a laminated manner. Fixing member 132 with an opening part is attached on another side of housing 140. The another side of housing 140 is open, and the opening part of fixing member 132 is located at the opening of housing 140. Transparent substrate 131 is fixed to fixing member 132 in a manner such as to close the opening part, at a position of which phosphor 130 is located. The laser beams which have passed through aspherical lens 120 enter phosphor 130. Phosphor 130 is irradiated with the convergent beams emitted from aspherical lens 120 as excitation beams, generating fluorescence. For the purpose of radiation of heat generated as a result of irradiating phosphor 130 with the laser beams, transparent substrate 131 is fixed at fixing member 132 formed of a material with high thermal conductivity through direct contact with fixing member 132 or with a heat dissipation grease in between.

Figure 3:
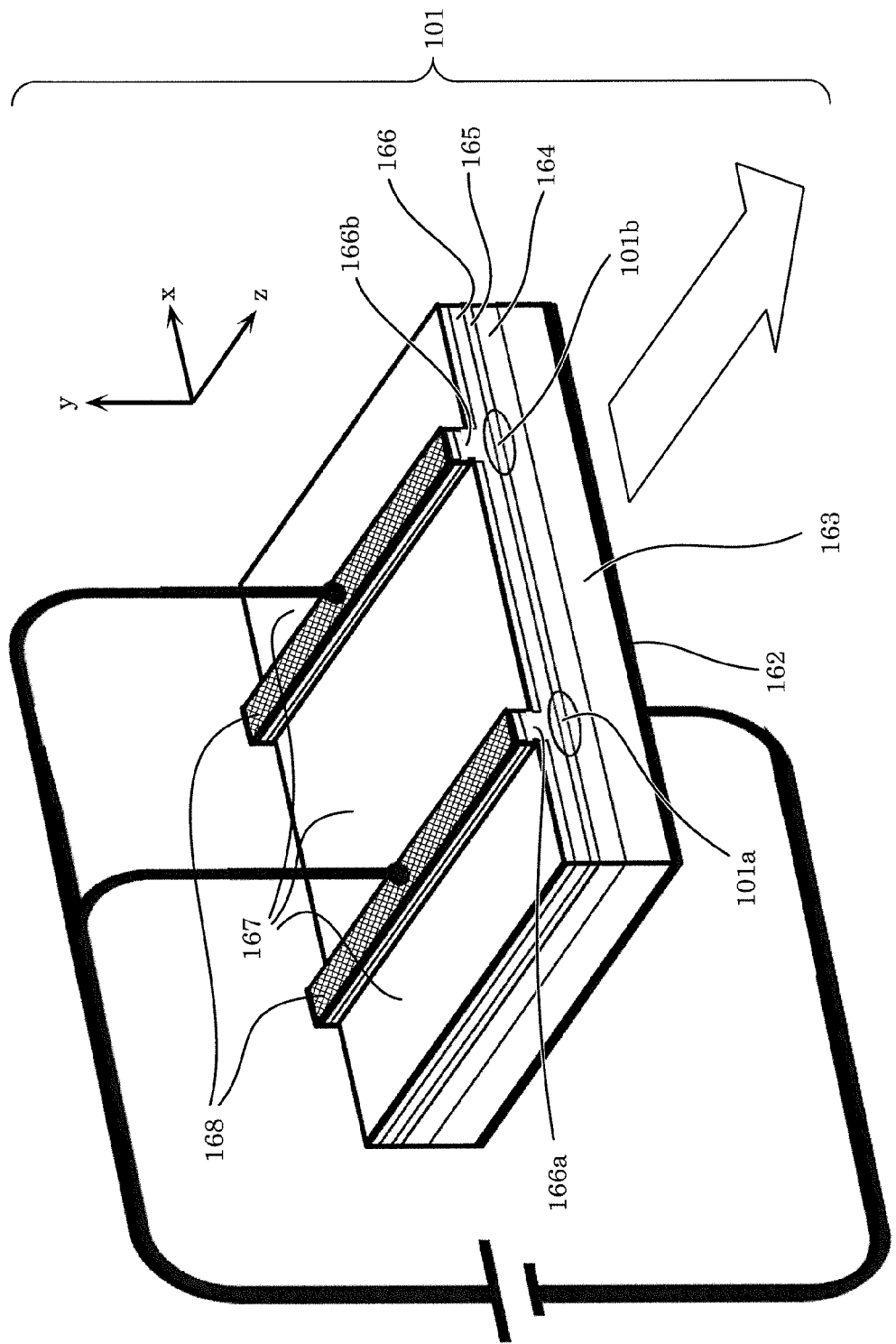
FIG. 3 is a perspective view illustrating schematic configuration and a current path of a semiconductor laser element used in the light-emitting device according to Embodiment 1.
Figure 4:
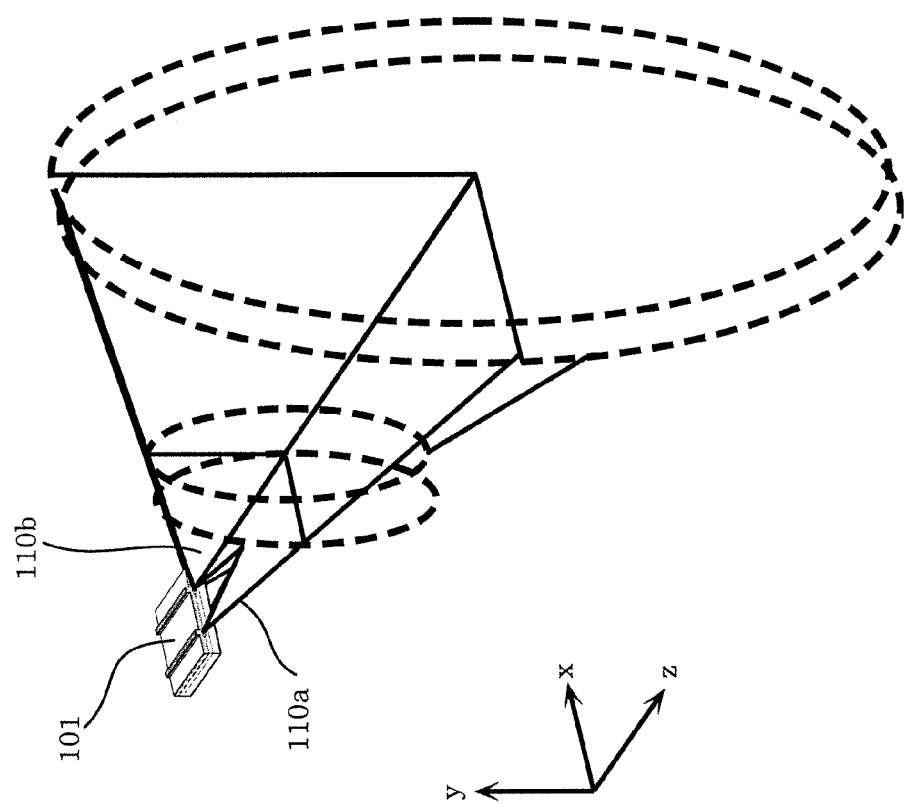
FIG. 4 is a diagram illustrating radiation shapes of laser beams emitted from the semiconductor laser element in Embodiment 1.

FIG. 3 is a perspective view illustrating schematic configuration of semiconductor laser element 101 and a current path used in the light-emitting device of Embodiment 1. FIG. 4 is a diagram illustrating radiation shapes of the laser beams emitted from semiconductor laser element 101. Note that FIGS. 3 and 4 also illustrate three-dimensional orthogonal coordinate axes including an x-axis, a y-axis, and a z-axis, which correspond to coordinate axes provided when semiconductor laser element 101 is mounted in laser light source 100 and which agree with the three-dimensional orthogonal coordinate axes illustrated in FIGS. 1 and 2.

As illustrated in FIG. 3, semiconductor laser element 101 has: n-type cladding layer 164 formed of, for example, AlGaN; an MQW active layer 165 formed of, for example, an InGaN well layer and a GaN barrier layer; and a p-type cladding layer 166 formed of, for example, AlGaN, all of which are laminated on semiconductor substrate 163 of, for example, GaN through epitaxial growth. Two ridge parts 166a and 166b are formed at p-type cladding layer 166. On p-type cladding layer 166, insulating layers 167 are formed on flat surfaces, on which ridge parts 166a and 166b are not formed, and on side surfaces of ridge parts 166a and 166b. P-side electrodes 168 are formed at ridge parts 166a and 166b. N-side electrode 162 is formed on a bottom surface of semiconductor substrate 163.

N-side electrode 162 and p-side electrode 168 are formed through, for example, disposition of an Au-based alloy or the like, and voltage application in a manner such as to flow a current from the p-side electrode towards the n-side electrode causes stimulated light emission in a region of the active layer located below ridge parts 166a and 166b. At this point, a refractive index of n-type cladding layer 164 and p-type cladding layer 166 is lower than a refractive index of active layer 165 formed between n-type cladding layer 164 and p-type cladding layer 166, so that the beams are locked in thin active layer 165. Moreover, p-side electrode 168 formed on an outer side of p-type cladding layer 166 is formed in stripes and insulating layer 167 is formed in other regions, thus providing a structure in which a current flow range is limited to a range of stripe widths of p-side electrode 168. As a result, a horizontal size of a light emission region is limited. Subjecting beams generated in a space limited in both vertical and horizontal directions to an infinite number of times of repeated beam reflection between wall-open end surfaces in front of and behind active layer 165 amplifies the beams, leading to release of the beams to an outside.

In Embodiment 1, laser light source 100 includes semiconductor laser element 101 having a plurality of light emission regions in a single element structure. Semiconductor laser element 101 has a multi-emitter structure having the two light emission regions from which a blue laser beam with a wavelength of 450 nm is emitted. More specifically, a portion below ridge part 166a serves as first light emission region 101a from which a first laser beam is emitted and a portion below ridge part 166b serves as second light emission region 101b from which a second laser beam is emitted. First light emission region 101a and second light emission region 101b are separated from each other, and a distance between light emission centers of first light emission region 101a and second light emission region 101b is several tens of micrometers to several hundreds of micrometers, which is controlled by a distance between ridge parts 166a and 166b. Moreover, first light emission region 101a and second light emission region 101b are formed through same crystal growth process. Thus, the laser beams emitted from first light emission region 101a and second light emission region 101b have almost same optical properties, and wavelengths of the aforementioned laser beams and spread angles of radiation beams have almost the same properties. Note that outer sizes of semiconductor laser element 101 are: several hundreds of micrometers to several millimeters in a horizontal direction (an x-axis direction), which is a length in accordance with a number of light emission regions and an interval between the light emission regions; around one hundred micrometers in a vertical direction (a y-axis direction), and order of several hundreds of micrometers to several millimeters in an anterior-posterior direction (a z-axis direction).

The laser beams released from first light emission region 101a and second light emission region 101b of semiconductor laser element 101 are radiated as divergent beams which widen in an elliptical cone shape at a given angle, as illustrated in FIG. 4. Sizes of each light emission region are: several micrometers or less in a vertical direction, which is controllable in order of nanometers through crystal growth; and order of several micrometers to one hundred micrometers in a horizontal direction, which is determined by a width of the ridge part. Thus, the laser beam greatly widens through refraction in the vertical (y-axis) direction in which the width of the light emission region is narrow, and the spread angle in the horizontal (x-axis) direction in which the width of the light emission region is wide is approximately one-half to one-fifth of the spread angle in the vertical direction. The distance between the light emission centers of the light emission regions corresponds to an interval of only several tens of micrometers to several hundreds of micrometers as described above. Thus, before separated 1 mm from an emission-side end surface of semiconductor laser element 101, the laser beam from the first light emission region and the laser beam from the second light emission region start to overlap in the horizontal direction. In the light-emitting device of Embodiment 1, semiconductor laser element 101 described with reference to FIGS. 3 and 4 is fixed on sub-mount 104 in a manner such that the directions of the x-axis, the y-axis, and the z-axis agree with directions of the x-axis, the y-axis, and the z-axis illustrated in FIGS. 1 and 2. The laser beam from the first light emission region and the laser beam from the second light emission region are almost entirely overlapping each other at a position where aspherical lens 120 is arranged.

Next, aspherical lens 120 of the present disclosure will be described.

Aspherical lens 120 is an optical element which converts, into the convergent beams, the laser beams emitted as the divergent beams from semiconductor laser element 101. Aspherical lens 120 has a difference in refractive power between inner circumference and outer circumference. For the convergent beams from aspherical lens 120, paraxial rays 116 from aspherical lens 120 are focused on focal plane 150 and rays 117 passing through an outer circumference part of aspherical lens 120 are focused at position 155 shifted from focal plane 150. A difference between focal positions on an inner circumference side and an outer circumference side of aspherical lens 120 is referred to as spherical aberration. The spherical aberration is caused by an increase in the refractive power from a central part towards surroundings of aspherical lens 120. The spherical aberration needs to be eliminated to the extent possible in order to make a beam spot on the focal plane as small as possible. Thus, a commercially available aspherical lens in general has an aspherical shape designed such that the spherical aberration becomes infinitely close to zero. Therefore, it is also possible to adjust the aspherical shape to increase an amount of the spherical aberration and adjust the focal position of the outer circumference part of the lens to a front or behind the focal plane.

On the other hand, as illustrated in FIG. 1, as a result of using aspherical lens 120 having the spherical aberration, that is, using a lens whose refractive power increases in a direction towards the outer circumference of aspherical lens 120 to squeeze the laser beams with a Gaussian intensity distribution, the rays 117 on the outer circumference side with small intensities collected on an inner side and overlap paraxial rays 116. Consequently, presented on a more front side than the focal plane by the aforementioned effects is a surface where a light intensity distribution is equal. The surface where the light intensity distribution is equal can be adjusted at a desired position between focal plane 150 and aspherical lens 120 by controlling the refractive power of the outer circumference part of aspherical lens 120 based on the design of the aspherical shape and then varying an amount of the spherical aberration.

Figure 5:
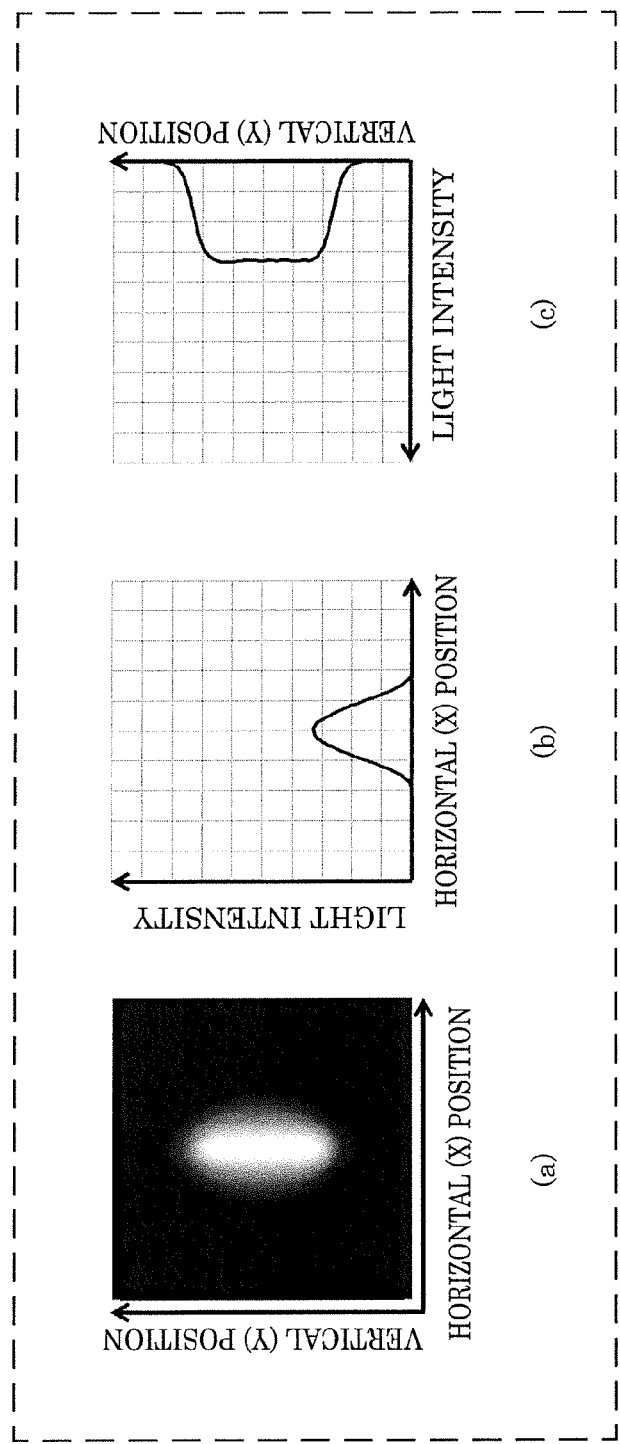
FIG. 5 is a diagram illustrating results of measurement of light intensity distributions in a horizontal direction and a vertical direction obtained on a surface where an intensity distribution of a convergent beam from an aspherical lens used in Embodiment 1 becomes equal as a result of making a single laser beam enter the aspherical lens.

FIG. 5 is a diagram illustrating results of measurement of light intensity distributions in the horizontal (x-axis) direction and the vertical (y-axis) direction obtained on a surface where an intensity distribution of a convergent beam from aspherical lens 120 becomes equal as a result of making a single laser beam enter aspherical lens 120 used in Embodiment 1. In FIG. 5, (a) illustrates a beam profile with a shape and the intensity distribution of the laser beam in an inverted gray scale, (b) illustrates the light intensity (integrated value) distribution in the horizontal direction, and (c) illustrates the light intensity (integrated value) distribution in the vertical direction. The laser beam caused to enter aspherical lens 120 to obtain the aforementioned measurement results has a radiation shape having a spread angle which is small in the x-axis direction and large in the y-axis direction.

The measurement results of FIG. 5 prove that the light intensity distribution in the y-axis direction in which the spread angle of the laser beam is large is equalized in a top hat shape through action of the spherical aberration of the aspherical lens, as illustrated in (c) of FIG. 5. The measurement results of FIG. 5 also prove that the light intensity distribution in the x-axis direction in which the spread angle of the laser beam is small is not in a top hat shape and not equalized, as illustrated in (b) of FIG. 5, which is assumed to be attributable to failure in obtaining effect of correcting the beam passing through the outer circumference due to passage of the laser beam only through a paraxial region of the aspherical lens. That is, there is a problem that the laser beam which is provided from the semiconductor laser element and which is asymmetrical with respect to an optical axis can be equalized only in either of the horizontal and vertical directions even when efforts are made to equalize the intensity distributions with the aspherical lens of a shape symmetrical with respect to the optical axis.

In the light-emitting device of Embodiment 1, first light emission region 101a and second light emission region 101b of semiconductor laser element 101 are arranged in a manner such as to be arrayed in the horizontal (x-axis) direction in which the spread angle of the laser beams is small. That is, the plurality of laser beams have different spread angles in the horizontal direction and the vertical direction and enter aspherical lens 120 while arrayed in the direction in which the spread angle is small. An end surface of semiconductor laser element 101 on a laser beam emission side is parallel to a main plane of aspherical lens 120, and first light emission region 101a and second light emission regions 101b are located at an equal distance from aspherical lens 120.

In the light-emitting device of Embodiment 1, as illustrated in FIG. 2, laser beam 110a from first light emission region 101a and laser beam 110b from second light emission region 101b enter aspherical lens 120 while almost overlapping each other. Laser beams 110a and 110b, which have entered aspherical lens 120, are converted into convergent beams 111a and 111b and irradiate to phosphor 130 while overlapping each other. In a case where no phosphor 130 is provided, convergent beams 111a and 111b pass through a position of phosphor 130 and then are focused on focal plane 150 in a completely separated manner.

Figure 6:
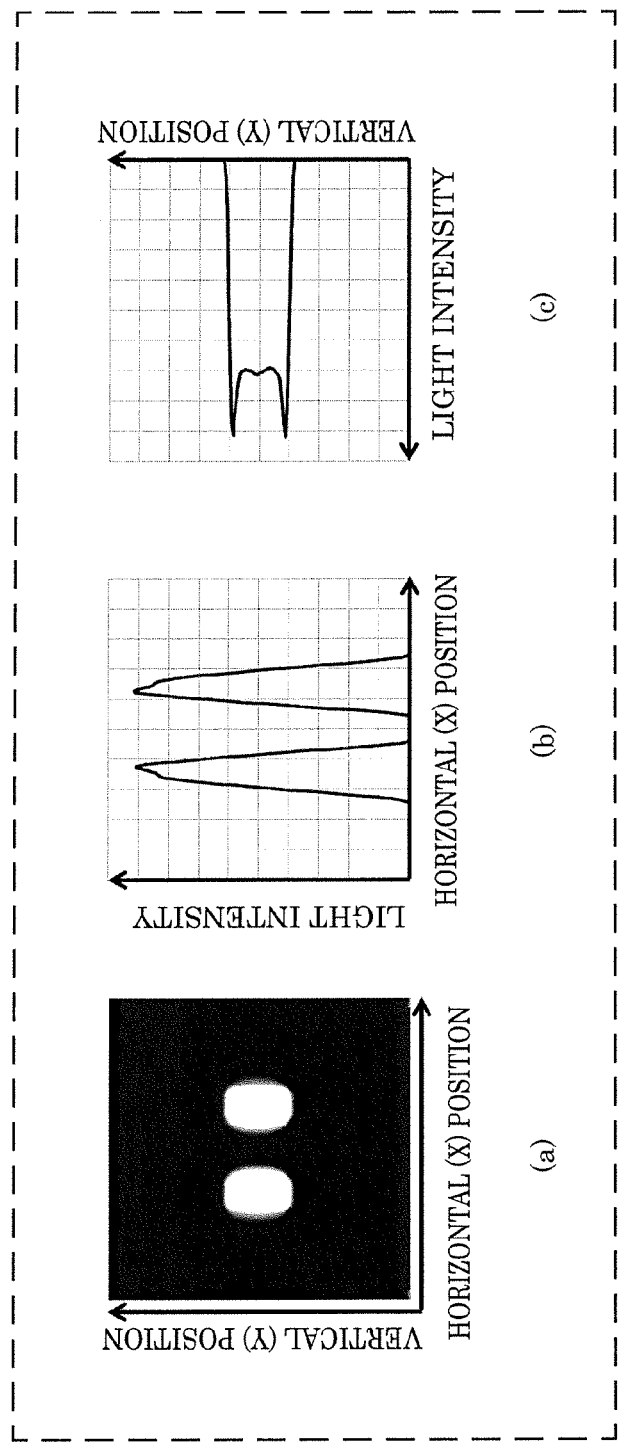
FIG. 6 is a diagram illustrating intensity distributions at a given position A-A located between a phosphor and a focal plane in Embodiment 1.
Figure 7:
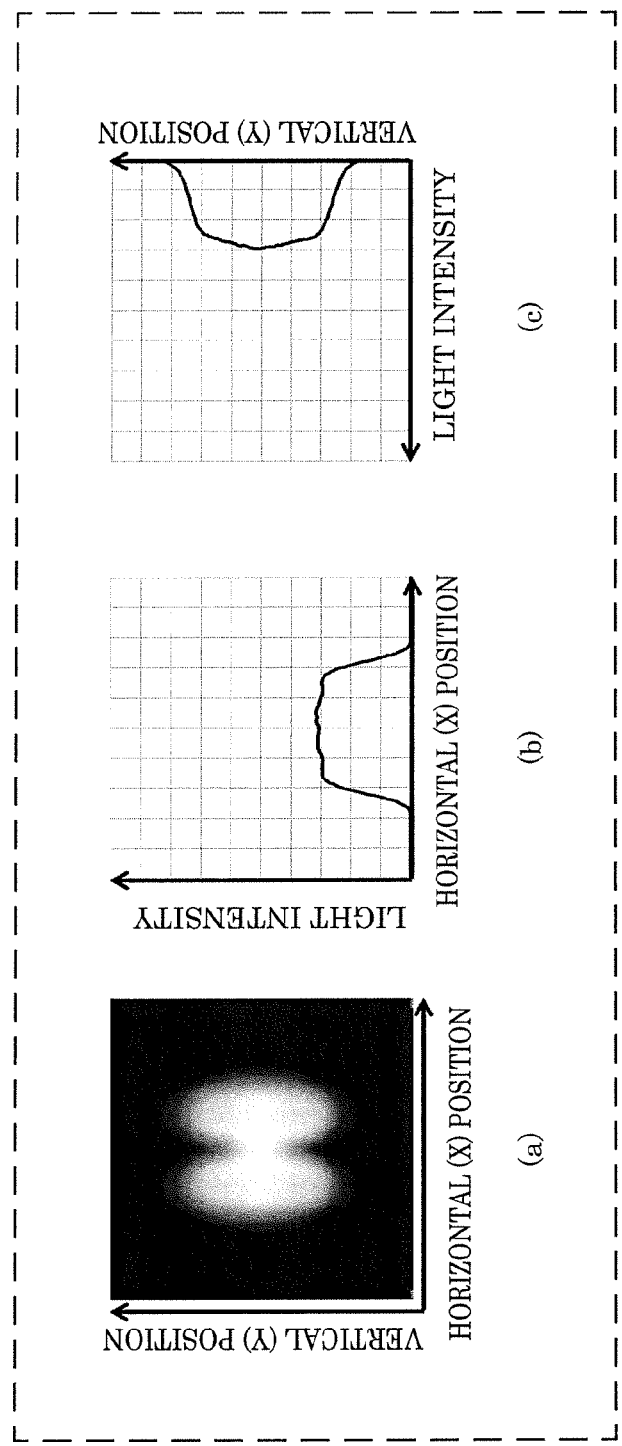
FIG. 7 is a diagram illustrating intensity distributions at a position B-B at which the phosphor is arranged in Embodiment 1.
Figure 8:
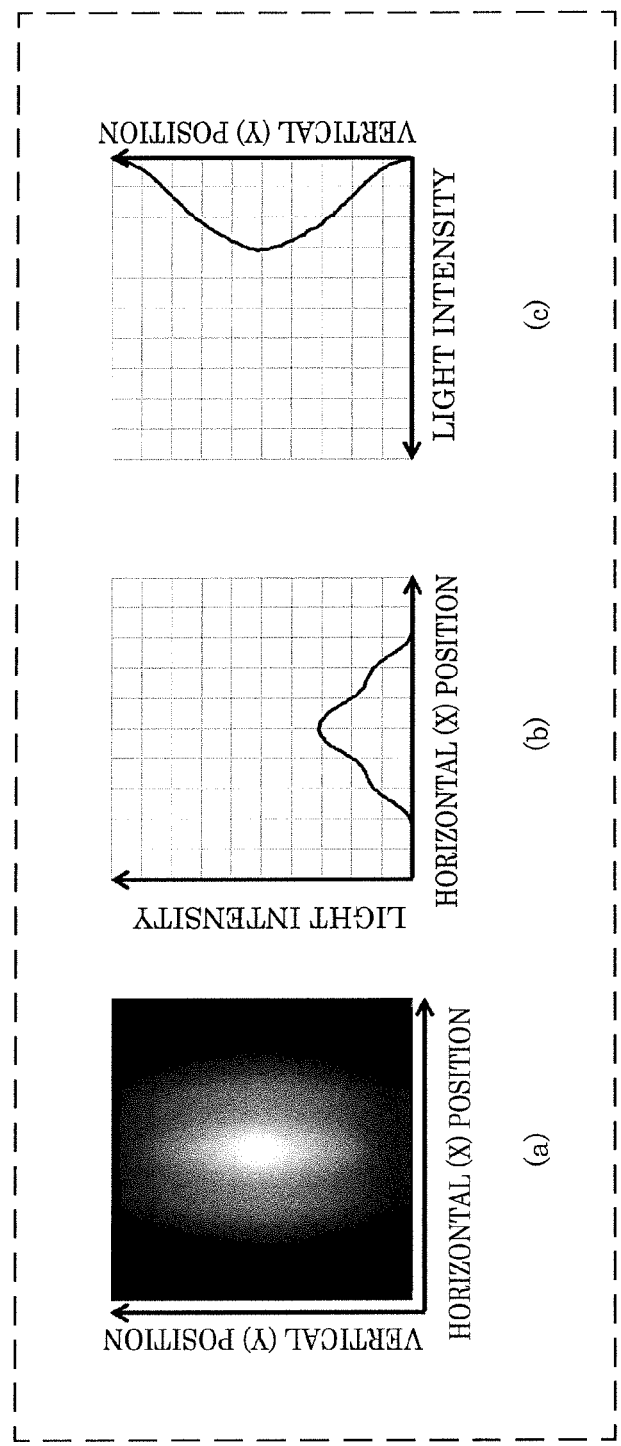
FIG. 8 is a diagram illustrating intensity distributions at a position C-C located between the aspherical lens and the phosphor in Embodiment 1.

Next, intensity distributions of convergent beams 111a and 111b between aspherical lens 120 and the focal plane in the light-emitting device of Embodiment 1 will be described. FIG. 6 illustrates intensity distributions at a desired position A-A (see FIG. 2) located between phosphor 130 and focal plane 150. FIG. 7 illustrates intensity distributions at a position B-B (see FIGS. 1 and 2) where phosphor 130 is arranged. FIG. 8 illustrates intensity distributions at a position C-C (see FIG. 2) located between aspherical lens 120 and phosphor 130. In FIGS. 6, 7, and 8, (a) illustrates a beam profile with a shape and the intensity distribution of the laser beam in an inverted gray scale, (b) illustrates the light intensity (integrated value) distribution in the horizontal (x-axis) direction, and (c) illustrates the light intensity (integrated value) distribution in the vertical (y-axis) direction.

As illustrated in FIGS. 6 to 8, the light intensity has a bimodal or unimodal distribution at the positions (the position A-A and the position C-C) in front of and behind the position where phosphor 130 is arranged. As illustrated in FIG. 7, at the position B-B where phosphor 130 is arranged, the light intensity distributions are equalized in a top hat shape in both the horizontal and vertical directions. The aforementioned light intensity distributions are provided because the intensity distributions in the vertical direction is equalized through action of aspherical lens 120 in the same manner as in a case of FIG. 5 and Gaussian light intensity distributions of the two convergent beams 111a and 111b in the horizontal direction overlap each other and a product of the two provides the equal intensity distribution. That is, aspherical lens 120 has a function of equalizing the light intensities in the horizontal and vertical directions in which the spread angles are large. In the present disclosure, adjustment is made in a manner such that phosphor 130 is arranged at a position where such a light intensity distribution is provided. That is, phosphor 130 is arranged at a position shifted towards aspherical lens 120 than towards the focal plane where the paraxial rays of the beam passing through aspherical lens 120 are focused.

Note that, in addition to positional adjustment of phosphor 130, a method of adjusting a distance between semiconductor laser element 101 and aspherical lens 120 with the position of phosphor 130 fixed is provided as an adjustment method for obtaining the equal light intensity distributions. More specifically, a position of semiconductor laser element 101 in the z-axis direction or a position of aspherical lens 120 in the z-axis direction may be adjusted to thereby vary positions of two convergent beams 111a and 111b on focal planes 150 and thereby vary a degree of the overlapping of the two convergent beams at the position B-B and obtain equal light intensity distributions as illustrated in FIG. 7 on phosphor 130.

Moreover, aspherical lens 120 used in the present embodiment has optimized spherical aberration in accordance with the spread angle of the laser beam, which has been emitted from semiconductor laser element 101, in the vertical (y-axis) direction in order to equalize the light intensity distribution in the vertical (y-axis) direction at the position B-B.

Phosphor 130 converts a synthetic beam of the convergent beams from aspherical lens 120 as an excitation beam into fluorescence with a distribution having a partially larger wavelength and releases the fluorescence to an outside. Moreover, remaining components of the excitation beam which have not been converted into the fluorescence are scattered by phosphor particles or a binder of the phosphor and contaminated particles and are released to an outside of the phosphor. The fluorescence and the scattered beam of the excitation beam are released with a Lambertian distribution in two directions vertical to a phosphor formation surface. Human vision recognizes a product of the aforementioned released beams, which enter eyes, as a color in accordance with a ratio between the fluorescence and the scattered beam. Thus, appropriately controlling the ratio with a thickness and density of the phosphor permits formation of a wavelength distribution which is viewed in white or a desired color.

Figure 9:
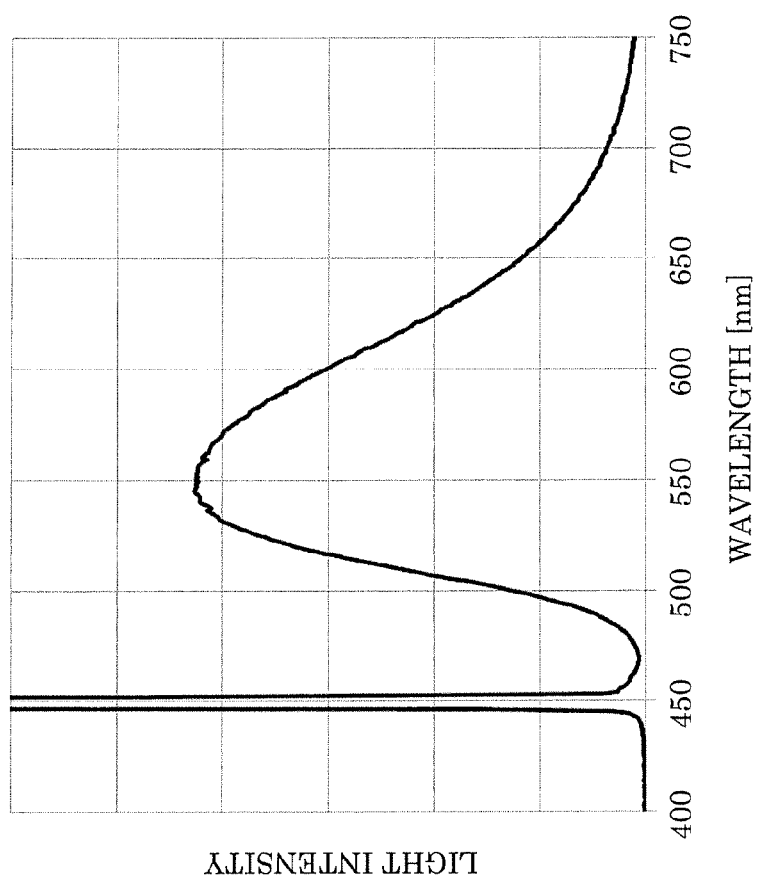
FIG. 9 is a diagram illustrating a wavelength distribution of a beam released from the phosphor to an outside in Embodiment 1.

FIG. 9 is a diagram illustrating a wavelength distribution of the beam released from phosphor 130 to the outside. In FIG. 9, a peak light intensity with a wavelength of 450 nm is provided by the excitation beam scattered without being converted into the fluorescence by phosphor 130, and a light intensity with a wavelength larger than the peak is provided by an optical component converted into the fluorescence at phosphor 130. Then the beam of the wavelength component illustrated in FIG. 9 is viewed white by the human.

As described above, in the light-emitting device of Embodiment 1, two laser beams 110a and 110b emitted from semiconductor laser element 101 enter the single aspherical lens, turning into the convergent beams, the excitation beams irradiate to phosphor 130, and the fluorescence is generated from phosphor 130. At this point, the convergent beams irradiating phosphor 130 are of a spot shape having an equal intensity distribution of a top hat shape in both the horizontal and vertical directions, as illustrated in FIG. 7. Thus, intensities of the excitation beams irradiating phosphor 130 do not partially increase, and luminance saturation caused by a density increase and temperature quenching and deterioration following a temperature increase are prevented.

In Embodiment 1, the two laser beams are caused to enter aspherical lens 120, but three or more laser beams may be caused to enter. In this case, intervals between light emission regions of the semiconductor laser element which emits each laser beam may be equal, which be easily realized by use of a semiconductor laser element with a multi-emitter structure having three or more light emission regions in a single element structure. Moreover, without use of the semiconductor laser element with the multi-emitter structure, a semiconductor laser element having one light emission region in a single element structure may be used to cause the plurality of laser beams to enter the aspherical lens in the same manner as in the aforementioned embodiments.

Moreover, the wavelength of the laser beam emitted from semiconductor laser element 101 is 450 nm, which corresponds to a blue beam in the present embodiment but with an excitation wavelength of the phosphor, a visible beam with a different wavelength or an ultraviolet beam may not be used. However, in case of the ultraviolet beam, a spectrum in a visible region in accordance with specifications of the light-emitting device needs to be generated only with fluorescence, and in a case where a plurality of wavelength distributions are required, the phosphor is mixed or laminated for use.

Moreover, a horizontal transverse mode of semiconductor laser element 101 may be a single mode or a multimode, but a multimode laser generally provides a higher output, and thus the multimode is desirable to provide a high-luminance light-emitting device.

Moreover, the interval between the light emission regions of semiconductor laser element 101 is several tens of micrometers to several hundreds of micrometers in the present embodiment. A smallest possible value of the interval results in an improvement in use efficiency of the laser beams entering the lens and brings a position in the z direction, in which the light intensity distribution in the horizontal direction is equalized, closer to the focal plane. Consequently, a spot size of the laser beams irradiating to the phosphor can be reduced and luminance of the beams from the phosphor also increases. Thus, the interval between the light emission regions of the semiconductor laser element is desirably equal to or less than one hundred micrometers, if possible.

Embodiment 2

Figure 10:
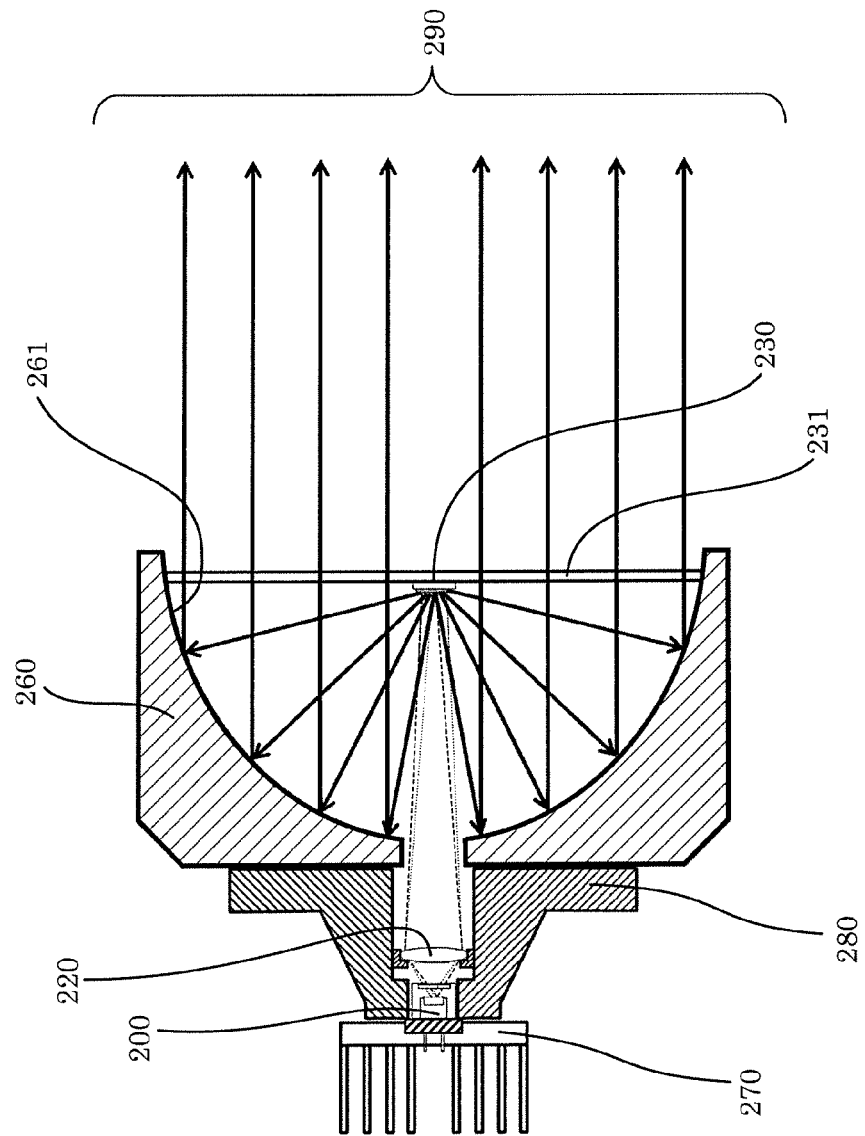
FIG. 10 is a sectional view illustrating schematic configuration of an illumination device according to Embodiment 2 of the present disclosure.

Embodiment 2 refers to a reflective illumination device using the light-emitting device of the present disclosure. FIG. 10 is a sectional view illustrating schematic configuration of the illumination device of Embodiment 2.

The illumination device of Embodiment 2 includes: as illustrated in FIG. 10, semiconductor laser element 200 with a multi-emitter structure which emits two laser beams; aspherical lens 220 which converts the laser beams, which have been emitted from semiconductor laser element 200, into convergent beams; phosphor 230 which is irradiated with the convergent beams from aspherical lens 220 as excitation beams; and reflector 260 (optical component) which reflects the beams radiated from phosphor 230 and releases the beams to an outside (in a predetermined direction).

Reflector 260 is arranged between aspherical lens 220 and phosphor 230 and is provided with a through hole for passage of the convergent beams from aspherical lens 220 towards phosphor 230. Reflector 260 has reflection surface 261 which is formed on a side facing phosphor 230 and includes a concave part with a parabolic surface. Transparent substrate 231 is attached to reflector 260 in a manner such as to close the concave part forming reflection surface 261, and phosphor 230 is attached to a central portion of a surface of transparent substrate 231 on a side facing reflection surface 261. Phosphor 230 is formed into a square, a rectangle, a circle, or an oval shape having a width of several hundreds of micrometers to several nanometers for the purpose of improving luminance. Moreover, a total reflection film of, for example, metal, aluminum, or an alloy of the aforementioned materials is formed between phosphor 230 and transparent substrate 231 for the purpose of reflecting radiated fluorescence and scattered beams towards a surface side which the excitation beams enter.

A temperature of semiconductor laser element 200 becomes high during operation, and thus as radiation measures against a temperature increase, semiconductor laser element 200 is in contact with radiation fin 270 of highly conductive metal such as aluminum or copper with a heat dissipation grease in between. Moreover, fixing member 280 is attached to a surface of reflector 260 on a side opposite to reflection surface 261, and semiconductor laser element 200 and aspherical lens 220 are attached to an inside of a central hole of fixing member 280.

In the light-emitting device of Embodiment 2, as is the case with the light-emitting device of Embodiment 1, the two laser beams emitted from semiconductor laser element 200 enter single aspherical lens 220, turning into the convergent beams, and irradiate phosphor 230 as the excitation beams, whereby the fluorescence is generated from phosphor 230. As illustrated in FIG. 7, the convergent beams irradiating phosphor 230 are beams of a spot shape having equal intensity distributions of a top hat shape in both a horizontal direction and a vertical direction. Thus, intensities of the excitation beams irradiating phosphor 230 do not partially increase, and lamination saturation caused by a density increase as well as temperature quenching and deterioration following a temperature increase are prevented.

The fluorescence generated from phosphor 230 is directed towards reflector 260 and is reflected on reflection surface 261. The beam reflected on reflection surface 261 is transmitted through transparent substrate 231 and released as illumination beam 290 to an outside.

The light-emitting device of the present embodiment, such as a spot illuminator or a vehicle headlight, is intended to irradiate a narrow region located in a distant area. Thus, reflection surface 261 of reflector 260 is formed into a parabolic surface, and phosphor 230 is arranged at a focal position of the parabolic surface to thereby provide configuration such that parallel beams irradiate the outside. Note that a reflection surface may be a spheroid for the purpose of forwardly projecting the illumination beam as a divergent beam.

Note that the present embodiment provides configuration such that reflection beams from reflector 260 are released to the outside from a surface at a position other than a position where phosphor 230 is formed. Thus, an entire front surface and an entire rear surface of transparent substrate 231 are AR-coated. Moreover, heat generated by phosphor 230 through the excitation beam irradiation is radiated from transparent substrate 231. Therefore, a material of transparent substrate 231 is suitably transparent glass or sapphire glass with higher heat conductivity if heat dissipation effect is to be more emphasized.

Moreover, the illumination device of Embodiment 2 has configuration such that the fluorescence from phosphor 230 is reflected on reflection surface 261 of reflector 260 and released in a predetermined direction. However, for example, an illumination device may be formed by arranging, between phosphor 130 and focal plane 150 in the light-emitting device of Embodiment 1 illustrated in FIGS. 1 and 2, a projection lens (optical component) for remote irradiation. In this case, the fluorescence generated from phosphor 130 with a Lambertian distribution and a scattered component of the excitation beams can be released as substantially parallel beams at a great distance in a predetermined direction.

The light-emitting device and the illumination device of the present disclosure have been described above with reference to Embodiments 1 and 2, but the present disclosure is not limited to the aforementioned embodiments. Modifications to Embodiments 1 and 2 that can be considered by those skilled in the art and another embodiment formed by combing part of the components in Embodiments 1 and 2 are also included in a range of the present disclosure without departing from the spirits of the present disclosure.

INDUSTRIAL APPLICABILITY

The present disclosure is applicable to, as a light-emitting device which suppresses a partial increase in an intensity of a laser beam irradiating a phosphor and prevents luminance saturation as well as temperature quenching and deterioration of the phosphor and an illumination device which uses, as an illumination beam, fluorescence generated by the light-emitting device, for example, all types of illumination devices which irradiate a phosphor with an excitation beam to obtain an illumination beam of a desired color, including, for example, a medical illumination device such as an endoscope, an illumination device such as a projector for obtaining RGB beams displaying a color video, and an illumination device which performs light emission with a wavelength distribution suitable for plant growth.

What is claimed is:

1. A light-emitting device, comprising:
   a laser light source which emits a plurality of laser beams;
   an aspherical lens which the plurality of laser beams emitted from the laser light source enter and which converts the plurality of laser beams into convergent beams; and
   a phosphor which is irradiated with the convergent beams from the aspherical lens as excitation beams to generate fluorescence, wherein
   the plurality of laser beams have different spread angles in a horizontal direction and a vertical direction and enter the aspherical lens while arranged in a direction in which the spread angle is smaller, from among the horizontal direction and the vertical direction,
   the aspherical lens causes the plurality of laser beams to have: light intensity distribution in a top hat shape in a direction in which the spread angle is larger, from among the horizontal direction and the vertical direction; and light intensity distribution not in the top hat shape in a direction in which the spread angle is smaller, from among the horizontal direction and the vertical direction, and
   both a light intensity in the horizontal direction and a light intensity in the vertical direction of a synthetic beam of the convergent beams from the aspherical lens are equalized at the phosphor.

2. The light-emitting device according to claim 1, wherein the phosphor is arranged at a position shifted closer to the aspherical lens than to a focal plane where paraxial rays of a beam passing through the aspherical lens are focused.

3. The light-emitting device according to claim 1, wherein the laser light source has, for the plurality of laser beams, a plurality of light emission regions arranged in the direction in which the spread angle is smaller.

4. The light-emitting device according to claim 3, wherein the laser light source includes a semiconductor laser element having the plurality of light emission regions in a single element structure.

5. An illumination device, comprising:
   the light-emitting device according to claim 1; and
   an optical component which releases, in a predetermined direction, the fluorescence generated from the light-emitting device.

* * * * *